US008913382B2

(12) United States Patent
Wang

(10) Patent No.: US 8,913,382 B2
(45) Date of Patent: Dec. 16, 2014

(54) SERVER

(75) Inventor: Shi-Feng Wang, Shanghai (CN)

(73) Assignee: Inventec Corporation, Taipei (TW)

( * ) Notice: Subject to any disclaimer, the term of this patent is extended or adjusted under 35 U.S.C. 154(b) by 387 days.

(21) Appl. No.: 13/402,598

(22) Filed: Feb. 22, 2012

(65) Prior Publication Data

US 2013/0063894 A1    Mar. 14, 2013

(30) Foreign Application Priority Data

Sep. 8, 2011    (CN) .......................... 2011 1 0266007

(51) Int. Cl.
*H05K 7/20* (2006.01)
*H05K 7/16* (2006.01)
*H05K 7/14* (2006.01)
*G06F 1/20* (2006.01)

(52) U.S. Cl.
CPC ................ *H05K 7/1492* (2013.01); *G06F 1/20* (2013.01); *H05K 7/20727* (2013.01); *H05K 7/20563* (2013.01); *H05K 7/20736* (2013.01); *G06F 2200/201* (2013.01)
USPC .............. 361/679.5; 361/679.51; 361/679.53; 361/695; 454/184

(58) Field of Classification Search
CPC . G06F 1/20; G06F 2200/201; H05K 7/20736; H05K 7/20563; H05K 7/20727; H05K 7/1492
USPC ............ 361/687, 695, 679.5, 679.51, 679.53, 361/727, 729–731, 679.02, 679.49, 692, 361/725; 454/184
See application file for complete search history.

(56) References Cited

U.S. PATENT DOCUMENTS

| 5,339,221 | A  | * | 8/1994  | Conroy-Wass et al. ........ 361/796 |
| 6,504,717 | B1 | * | 1/2003  | Heard ............................ 361/695 |
| 6,924,981 | B2 | * | 8/2005  | Chu et al. ....................... 361/696 |
| 6,987,673 | B1 | * | 1/2006  | French et al. .................. 361/727 |
| 7,042,720 | B1 | * | 5/2006  | Konshak et al. ........... 361/679.33 |
| 7,139,170 | B2 | * | 11/2006 | Chikusa et al. ................ 361/695 |
| 7,154,748 | B2 | * | 12/2006 | Yamada ......................... 361/690 |
| 7,187,547 | B1 | * | 3/2007  | French et al. ............. 361/679.33 |
| 7,215,552 | B2 | * | 5/2007  | Shipley et al. ................. 361/721 |
| 7,262,962 | B1 | * | 8/2007  | McLeod et al. ........... 361/679.48 |
| 7,307,837 | B2 | * | 12/2007 | Merkin et al. ............ 361/679.33 |
| 2003/0053293 | A1 | * | 3/2003 | Beitelmal et al. ............. 361/687 |
| 2004/0109288 | A1 | * | 6/2004 | Beitelmal et al. ............. 361/687 |
| 2004/0166905 | A1 | * | 8/2004 | Cherniski et al. .......... 455/575.1 |
| 2004/0184233 | A1 | * | 9/2004 | Yamada ......................... 361/690 |
| 2004/0264128 | A1 | * | 12/2004 | Crippen et al. ............... 361/687 |
| 2006/0106952 | A1 | * | 5/2006 | Bomhoff et al. ................ 710/10 |

(Continued)

*Primary Examiner* — Anatoly Vortman
(74) *Attorney, Agent, or Firm* — CKC & Partners Co., Ltd.

(57) ABSTRACT

A server includes a rack, at least one server unit, at least one communication exchange unit, at least one rack control unit and an electric power transmission unit. The rack has a plurality of shelving spaces. The server unit, the communication exchange unit, and the rack control unit are moved into or moved out of a corresponding shelving space along a horizontal axis, respectively. The server unit is communicatively connected to the communication exchange unit, and communicates with the rack control unit through the communication exchange unit. The electric power transmission unit is disposed in the rack and runs adjacent to the shelving spaces along a vertical axis. After the server unit, the communication exchange unit and the rack control unit are moved into corresponding shelving spaces, the server unit, the communication exchange unit and the rack control unit are electrically connected to the electric power transmission unit.

15 Claims, 17 Drawing Sheets

(56) References Cited

U.S. PATENT DOCUMENTS

| | | |
|---|---|---|
| 2006/0176665 A1* | 8/2006 | Matsushima et al. ......... 361/687 |
| 2007/0002536 A1* | 1/2007 | Hall et al. .................... 361/695 |
| 2007/0274039 A1* | 11/2007 | Hamlin ........................ 361/695 |
| 2008/0055846 A1* | 3/2008 | Clidaras et al. ............... 361/687 |
| 2008/0094799 A1* | 4/2008 | Zieman et al. ................ 361/695 |
| 2008/0113604 A1* | 5/2008 | Tufford et al. ................ 454/187 |
| 2010/0290186 A1* | 11/2010 | Zeng et al. .................... 361/694 |

* cited by examiner

SERVER

CROSS-REFERENCE TO RELATED APPLICATION

This application claims the priority benefit of China application serial no. 201110266007.4, filed Sep. 8, 2011. The entirety of the above-mentioned patent application is hereby incorporated by reference herein and made a part of this specification.

BACKGROUND OF THE INVENTION

1. Field of the Invention

The present invention relates to a server, in particular, to a server having both electric power and heat dissipation transmission layouts.

2. Description of Related Art

A server is a core computer serving computers in a network system, may provide functions such as a magnetic disk and a print service required by a network user, and meanwhile may also be used for clients to share resources in a network environment with each other. A basic architecture of the server is approximately the same as that of a general personal computer, and is formed of components such as a Central Processing Unit (CPU), a memory and an Input/Output (I/O) apparatus. The components are connected by a bus inside the server, and the CPU is connected to the memory through a north bridge chip, and connected to the I/O apparatus through a south bridge chip. Server cabinet structures have evolved from early tower cabinet servers to frame or rack servers emphasizing centralized performances to blade servers suitable for high density computations.

Herein, taking a frame or rack server as an example, the frame server is a server whose appearance is designed according to a uniform standard, and which is uniformly used in cooperation with a rack. In other words, the frame server is a tower server which has an optimized structure, and whose design aims to reduce space occupation of the server as much as possible. Many professional network apparatuses adopt the frame structure, and mostly are of a plat type, which is just like a drawer, such as an exchanger, a router, and a hardware firewall. The width of the frame server is 19 inches, the unit of the height thereof is U (1 U=1.75 inches=44.45 millimeters), and generally there are several standard servers of 1 U, 2 U, 3 U, 4 U, 5 U, and 7 U in height.

In an existing rack, apparatus units such as a server, an exchanger, and a rack controller generally all adopt respective independent power supply modes, and each apparatus unit may be connected to an internal or external power supply. Therefore, it is difficult to uniformly manage a plurality of power supplies in a rack, and independent operation of each power supply causes the total power consumption to be high.

Furthermore, as the operation speed of the server is continuously increased, heat generation power of electronic elements inside the server also continuously rises. In order to prevent the electronic elements inside the server from being overheated, which results in temporary or permanent failure of the electronic elements, it becomes very important to provide sufficient heat dissipation performance to the electronic elements inside the server. Each apparatus unit in the existing rack is connected to a power supply through a cable, and as the number of apparatus units increases, cables in the rack accordingly become messy. These disposed cables, which are not sorted out easily, complicate efforts to replace or service a server unit. Meanwhile, because flowing of an air flow is obstructed, the heat dissipation efficiency of the server unit is reduced. When the plurality of internal power supplies is in operation, they also generate a large amount of heat, which may not be optimal given the heat dissipation design of the rack.

SUMMARY OF THE INVENTION

Accordingly, the present invention is directed to a server, whose rack has good layout disposition so as to improve operability and heat dissipation efficiency of the server.

An embodiment of the present invention provides a server, which includes a rack, at least one server unit, at least one communication exchange unit, at least one rack control unit and an electric power transmission unit. The rack has a plurality of shelving spaces. The server unit, the communication exchange unit and the rack control unit are operable to be moved into or moved out of a corresponding shelving space along a horizontal axis respectively. The server unit is communicatively connected to the communication exchange unit, and communicates with the rack control unit through the communication exchange unit. The electric power transmission unit is disposed in the rack and runs adjacent a shelving spaces along a vertical axis. After any of the units is moved into a corresponding shelving space, the unit is electrically connected to the electric power transmission unit respectively.

In an embodiment of the present invention, the electric power transmission unit includes a power transmission module support base and a power transmission module. The power transmission module support base is mounted to the rack back and extends along the vertical axis. The power transmission module is superimposed on a surface of the base along a direction of the vertical axis, so as to transfer electric power to the server unit, the communication exchange unit and the rack control unit. The power transmission module includes a first conductive plate, an insulating layer, a second conductive plate sequentially superimposed on the power transmission module support base, a first power binding post plugged on the first conductive plate, a second power binding post plugged on the second conductive plate and a plurality of output pin pairs. The insulating layer is disposed between the first conductive plate and the second conductive plate. The first power binding post and the second power binding post are provided for connection to the power supply unit to obtain electric power supply. Each output pin pair includes a first output pin plugged on the first conductive plate and a second output pin plugged on the second conductive plate. The output pin pairs are provided for connection to the server unit, the communication exchange unit and the rack control unit in the rack, so as to transfer electric power to the server unit, the communication exchange unit and the rack control unit.

In an embodiment of the present invention, a plurality of pairs of positioning posts are disposed on the power transmission module support base, and positions of each pair of positioning posts are aligned with an output pin pair protruding on the first conductive plate and the second conductive plate. A pair of positioning holes are disposed in each of the server, communication exchange, and rack control units. Each pair of positioning posts are correspondingly plugged into the positioning holes in the server, communication exchange, or rack control unit, and each corresponding output pin pair is electrically connected to a pair of electrodes of the same unit, so as to transfer electric power to the unit. Groups of positioning posts and corresponding output pin pairs are provided in the same relative position for each layer of shelving space in the rack.

In an embodiment of the present invention, the server unit/communication exchange unit/rack control unit includes a chassis and an electrical connection module. The electrical connection module includes a housing, an adjustable position limiting piece, a circuit board, and at least one connector. The positioning holes are located in the housing. The adjustable position limiting piece connects the housing onto the chassis, and an adjustment space region is formed between the housing and the chassis. The position of the housing may vary relative to the chassis in the adjustment space region. The circuit board is disposed in the housing, and has a first connection end corresponding to the chassis and a second connection end for connection to the power distribution module. The connector is located on the circuit board and is electrically connected to the second connection end. The electrode is located on the connector. When the chassis enters the shelving space, a corresponding group of positioning posts on the power distribution module are plugged into the positioning hole, and corresponding output pin pairs are electrically connected to electrodes respectively.

In an embodiment of the present invention, there are at least two communication exchange units including a management network exchange unit and a serving network exchange unit. There are also a plurality of server units. Each of the server units has a management network interface and a serving network interface. The management network interface of each of the server units is communicatively connected with the management network exchange unit. The serving network interface of each of the server units are communicatively connected with the serving network exchange unit. The rack control unit has a management network interface and is connected to the management network exchange unit through the management network interface, thereby performing communication in a management network with each of the server units.

In an embodiment of the present invention, at least one power supply unit is disposed in the middle of at least one corresponding shelving spaces. Each communication exchange unit is located in a shelving space close to the power supply unit. Each power supply unit has a management network interface and is connected to the management network exchange unit through the management network interface.

In an embodiment of the present invention, an internal front portion of the rack is disposed with a cable sorting structure. A plurality of communication cables between the communication exchange unit and the server and rack control unit are threaded in the cable sorting structure.

In an embodiment of the present invention, the rack includes a body, a front frame and a rear frame. The body has the shelving space. The front frame and the rear frame are mounted to two opposite sides of the body. The front frame has an air inlet, and the rear frame has an air outlet. The electric power transmission unit is mounted to the rear frame. An air flow flows into the rack along the vertical axis from the air inlet, flows through the server units along the horizontal axis, and flows out of the rack from the air outlet.

In an embodiment of the present invention, the rack further includes a cover and at least one fan module. The cover is openably and closably mounted to the front frame. When the cover is closed relative to the front frame, a first flow passage is formed between the cover, the front frame and the body, and the first flow passage is parallel to the vertical axis and is connected to the air inlet. The rack further has a plurality of second flow passages, respectively connected between the first flow passage and the air outlet. The fan module is mounted to the air outlet of the rear frame. The fan module withdraws the air flow in the second flow passage from the rack along the horizontal axis. On a plane with the horizontal axis being a normal, an orthogonal projection of the electric power transmission unit on the plane does not overlap orthogonal projections of the air outlet and the second flow passage on the plane respectively.

In an embodiment of the present invention, the at least one fan module includes a plurality of fan modules, which is disposed at the air outlet of the rear frame, in which the fan modules are arranged along the vertical axis. Each of the fan modules is aligned with a plurality of the shelving spaces. Each fan module includes a fan shelf, a movable curtain board and a plurality of fan units. The fan shelf is detachably mounted to the rear frame. The fan shelf is electrically connected to the rack independently and is suitable for being detached from the rack independently. The movable air vent apparatus is mounted to the fan shelf and opens or closes the air outlet. The fan units respectively are detachably mounted to the fan shelf along the horizontal axis and are arranged along a horizontal direction. The fan units are electrically connected to the fan shelf independently, and are detached from the fan shelf along the horizontal axis independently or are mounted to the fan shelf reversely and independently.

In an embodiment of the present invention, the electric power transmission unit is disposed between the fan module and the shelving space of the rack. The electric power transmission unit further includes a plurality of fan pin pairs. Each fan pin pair includes a first fan pin plugged on the first conductive plate, and a second fan pin plugged on the second conductive plate. Both the first fan pin and the second fan pin protrude toward the fan module through through-holes in the power distribution module support base and are connected to the fan unit, so as to transfer electric power to the fan unit.

In an embodiment of the present invention, each fan module has a management network interface and is connected to the management network exchange unit through the management network interface. The rack control unit communicates with the fan module through the management network exchange unit.

In an embodiment of the present invention, the front frame has a first net structure, so as to form the air inlet. The server unit has a pair of second net structures. The air flow passes through the shelving spaces through the second net structures.

In an embodiment of the present invention, the cable sorting structure is disposed at the front frame, and is located beside the first flow passage.

In an embodiment of the present invention, the front frame has a recess located in an inner wall thereof, and the cable sorting structure includes a plurality of position limiting pieces, which is disposed in the recess in an array along the vertical axis. Each of the position limiting pieces includes a collar parallel to a plane with the vertical axis being a normal. The cables are threaded through or inserted into the collars.

In an embodiment of the present invention, the server further includes a plurality of pairs of rails, which is mounted to the body in an array along the vertical axis, and forms the shelving spaces. The server unit is moved into or moved out of the shelving space along the rails.

Based on the above description, in the embodiment of the present invention, through the internal layout and the relevant disposition of the rack, and the electric power transmission unit disposed in the rack, the server uniformly supplies power to the apparatus units including the communication exchange unit and the rack control unit in the rack, thereby conveniently and effectively performing entire management and power consumption control, and effectively saving the number of cables of each apparatus unit and the layout thereof. In addition to simplifying the internal layout of the rack to improve the operation convenience of the server unit, this practice can achieve good heat dissipation efficiency in cooperation with the particularly designed heat dissipation air passage. Further, the centralized fan system is also convenient for uniform management and control and energy consumption reduction.

In order to make the aforementioned features and advantages of the present invention more comprehensible, embodiments are illustrated in detail hereinafter with reference to accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
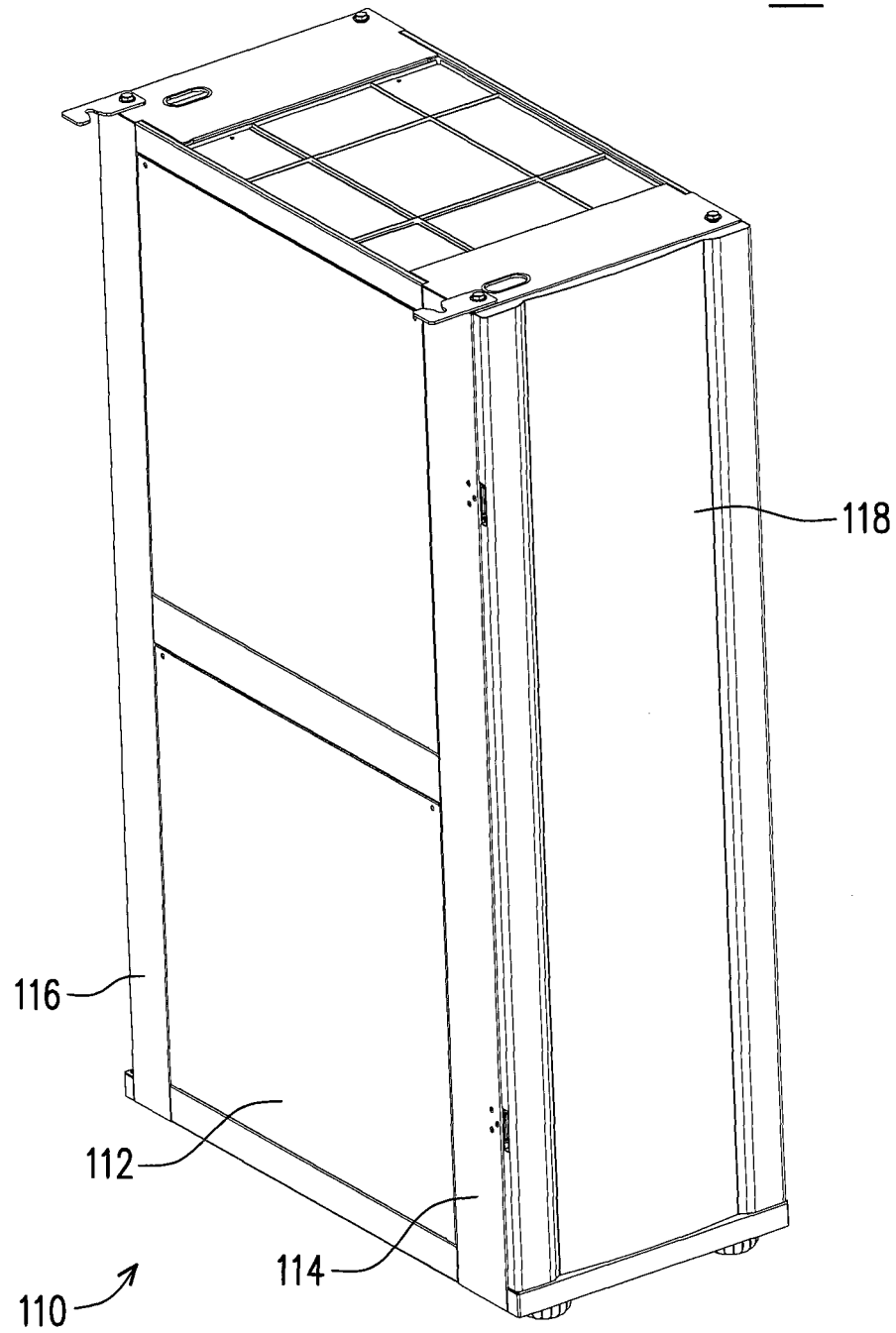
FIG. 1A and FIG. 1B are schematic views of a server according to an embodiment of the present invention at different viewing angles respectively.

Reference will now be made in detail to the present embodiments of the invention, examples of which are illustrated in the accompanying drawings. Wherever possible, the same reference numbers are used in the drawings and the description to refer to the same or like parts.

Figure 1B:
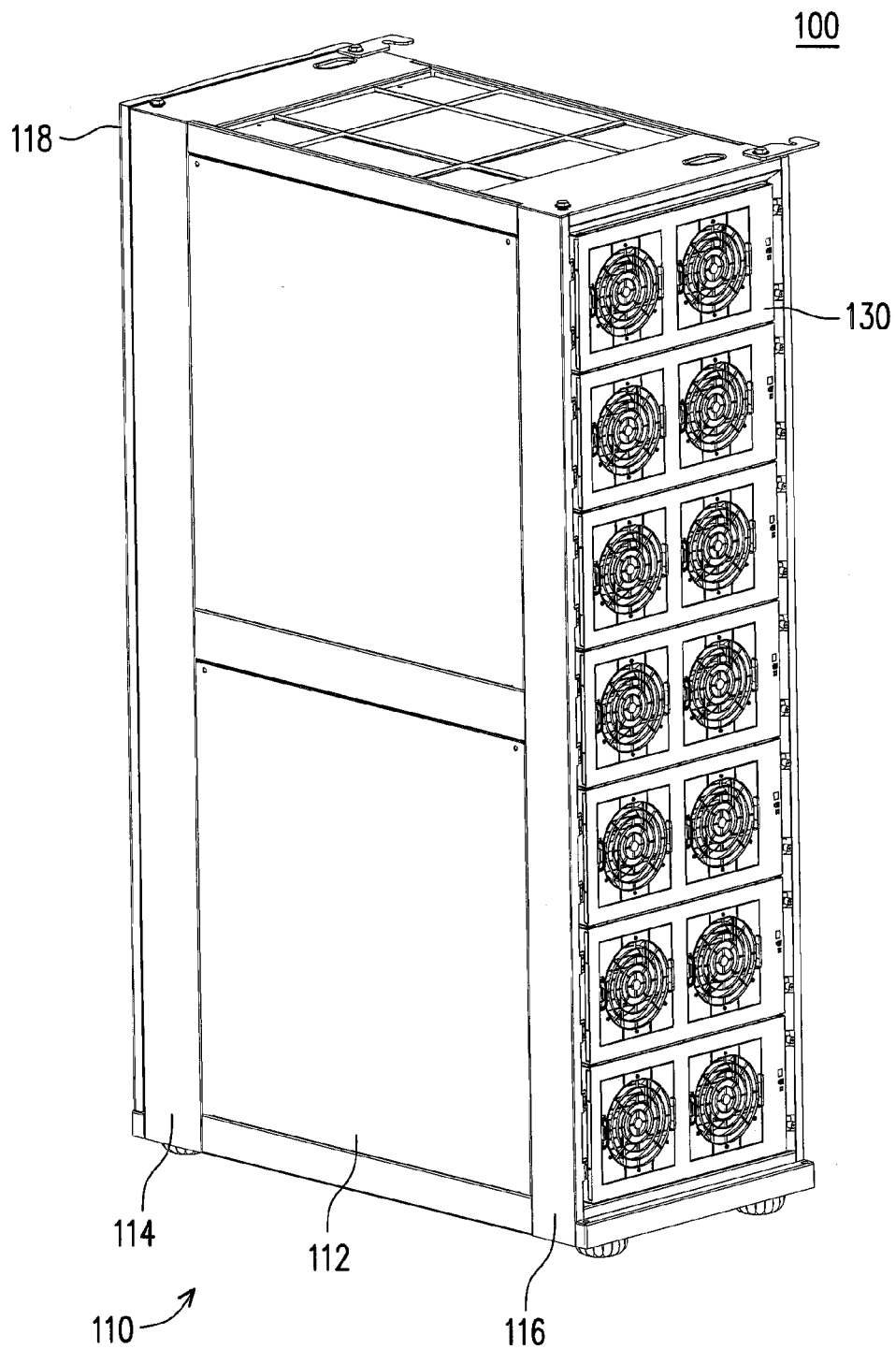
Figure 2A:
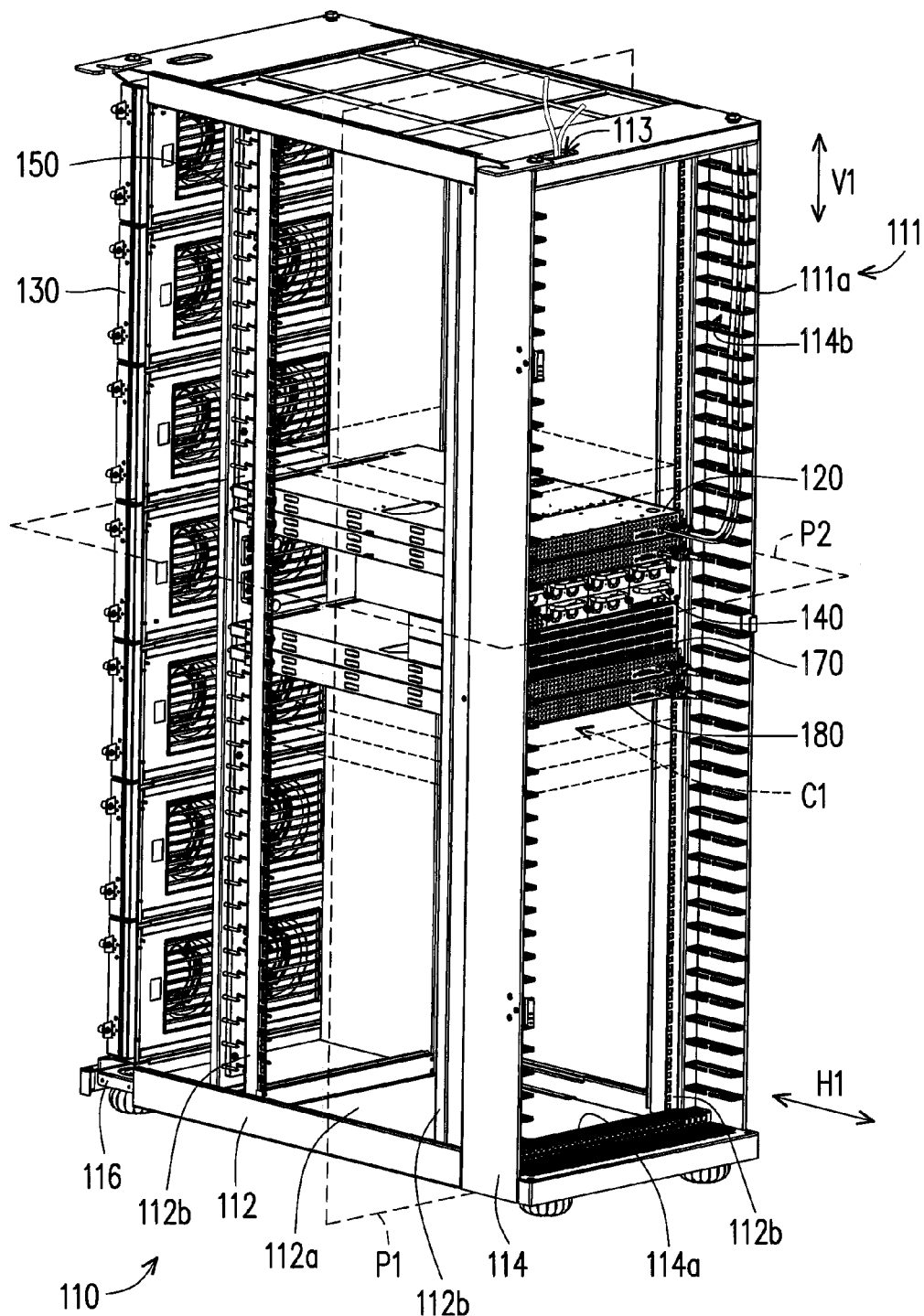
FIG. 2A and FIG. 2B are schematic views of a part of components in the server in FIG. 1A and FIG. 1B at different viewing angles respectively.
Figure 2B:
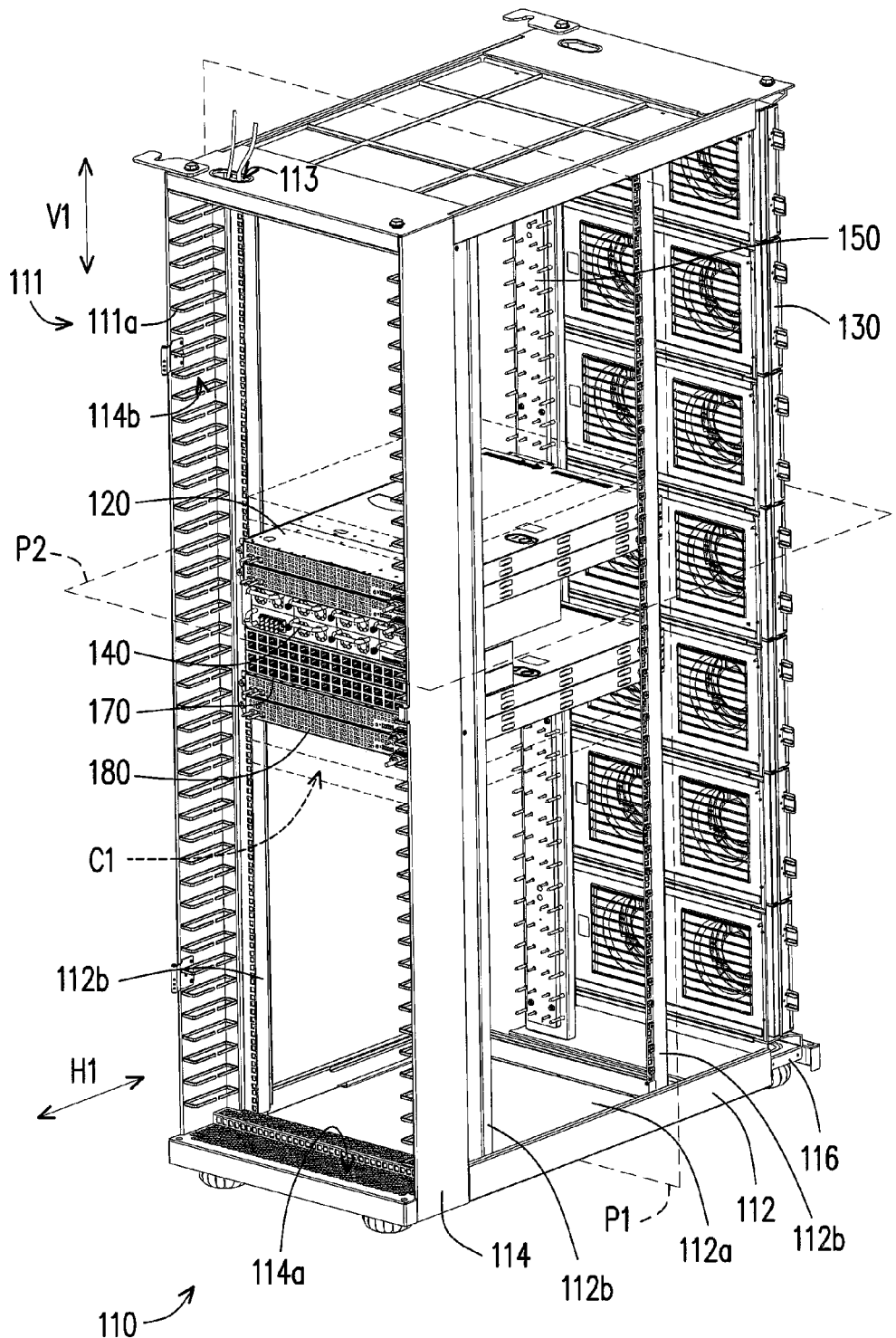

FIG. 1A and FIG. 1B are schematic views of a server according to an embodiment of the present invention at different viewing angles respectively. FIG. 2A and FIG. 2B are schematic views of a part of components in the server in FIG. 1A and FIG. 1B at different viewing angles respectively. Referring to FIG. 1A, FIG. 1B, FIG. 2A and FIG. 2B, in this embodiment, a server 100 includes a rack 110, at least one server unit 120, a plurality of fan modules 130, a power supply unit 140, an electric power transmission unit 150, at least one communication exchange unit 170 and at least one rack control unit 180. The rack 110 has a plurality of shelving spaces C1.

The number of power supply units 140, server units 120, communication exchange units 170 and rack control units 180 are not necessarily limited to those depicted herein. In this embodiment, only one power supply unit 140, two server units 120, two communication exchange units 170, two rack control units 180 and a part of shelving spaces C1 are drawn for representation.

The server unit 120, the communication exchange unit 170, the rack control unit 180 and the power supply unit 140 are moved into or moved out of a corresponding shelving space C1 along a horizontal axis H1 respectively. The electric power transmission unit 150 is disposed in the rack 110, is electrically connected to the power supply unit 140, and runs adjacent to the shelving spaces C1 along a vertical axis V1. In this embodiment, the vertical axis V1 and the horizontal axis H1 are perpendicular to each other. Therefore, after the server unit 120, the communication exchange unit 170 and the rack control unit 180 are moved into the corresponding shelving space C1, the server unit 120, the communication exchange unit 170 and the rack control unit 180 are connected to the electric power transmission unit 150, so that electric power of the power supply unit 140 is transferred to the server unit 120, the communication exchange unit 170 and the rack control unit 180 through the electric power transmission unit 150.

Figure 3:
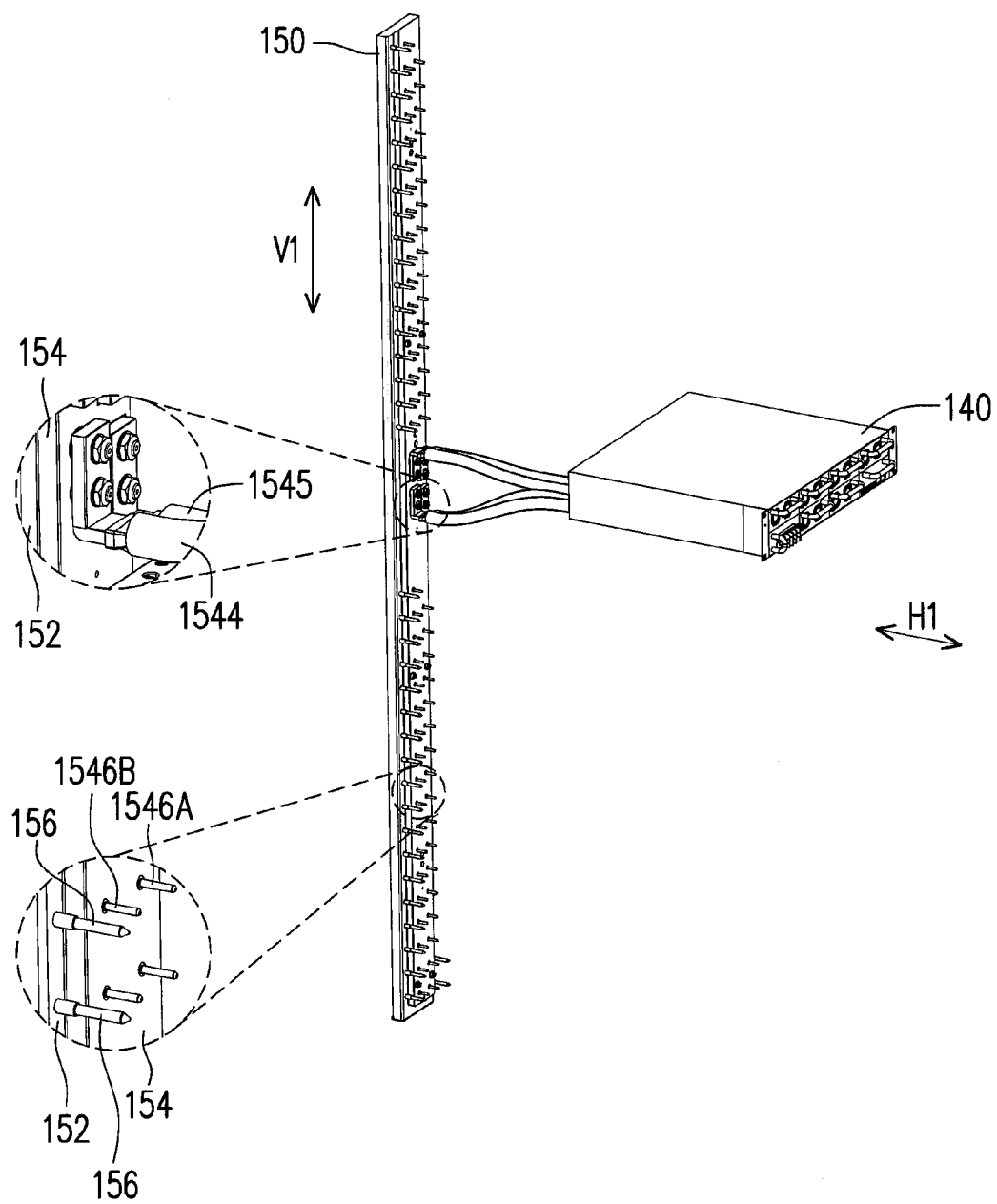
FIG. 3 is a schematic view of a part of components in the server in FIG. 2A.
Figure 4A:
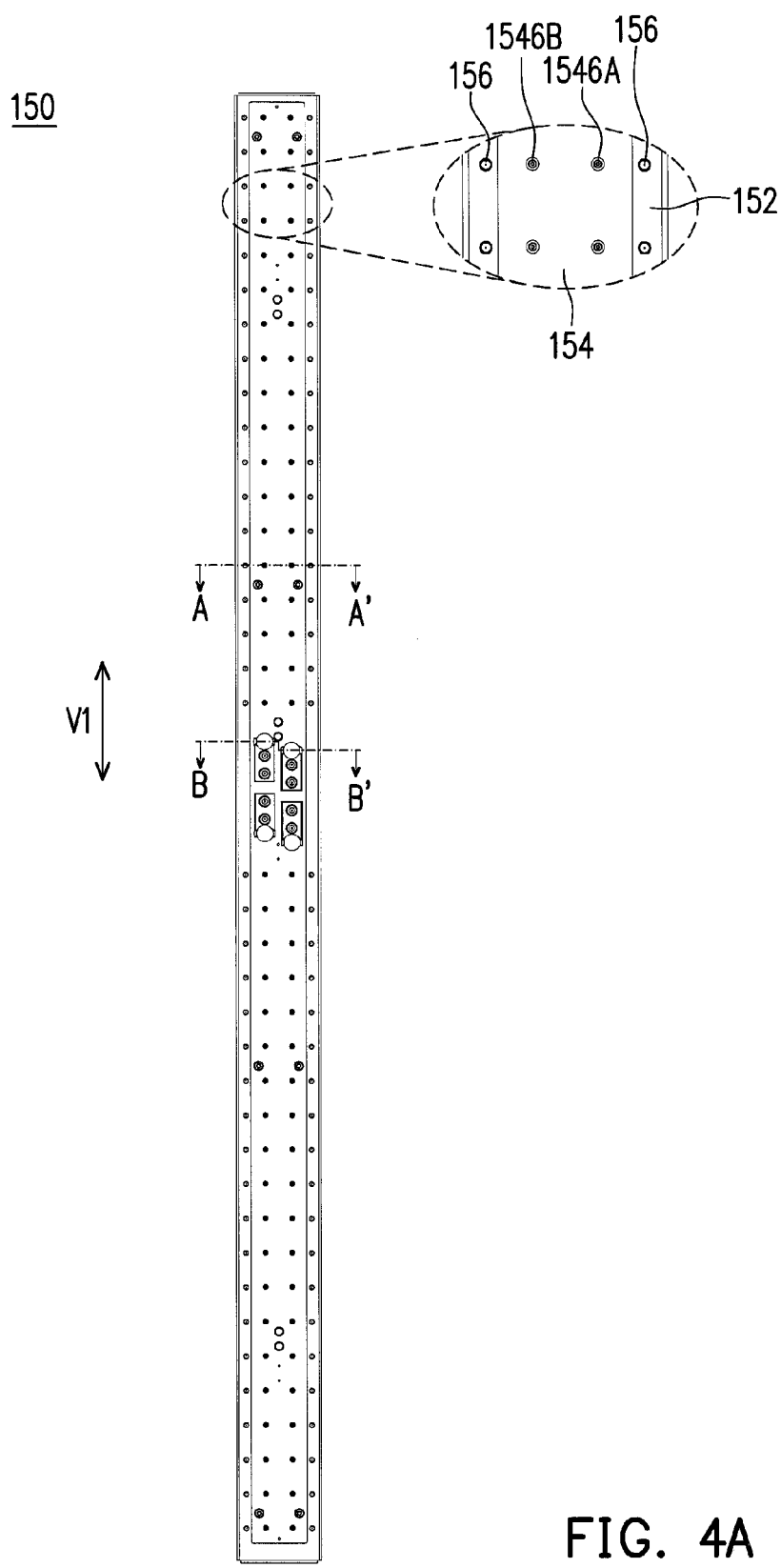
FIG. 4A is a front view of an electric power transmission unit in FIG. 3.
Figure 4B:
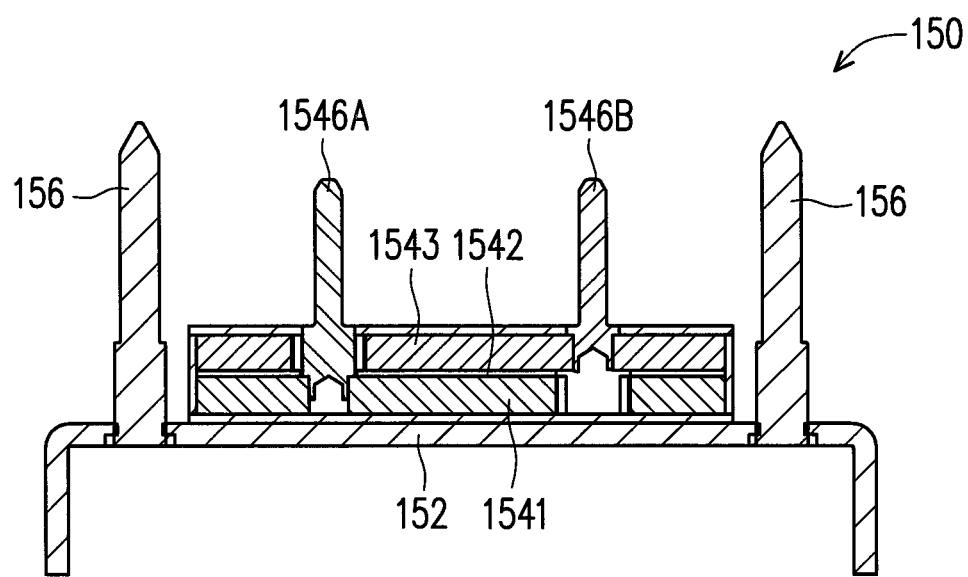
FIG. 4B is a sectional view of the electric power transmission unit in FIG. 3 along Line A-A'.
Figure 4C:
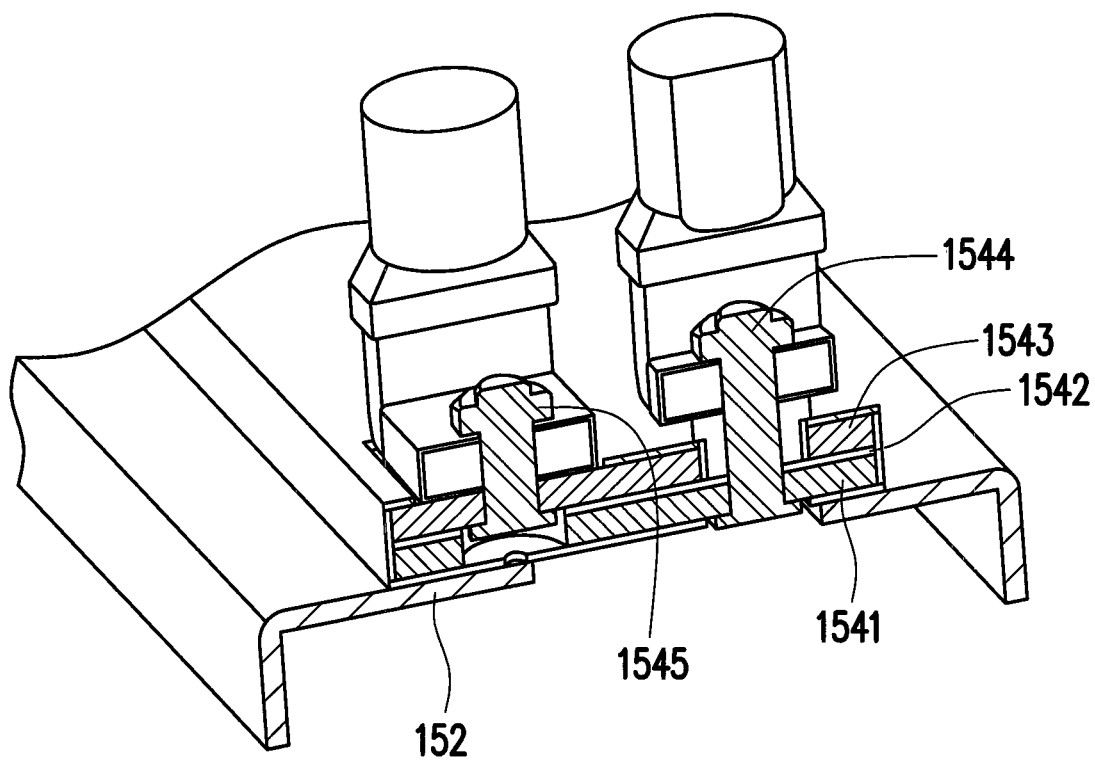
FIG. 4C is a sectional view of the electric power transmission unit in FIG. 3 along Line B-B'.

FIG. 3 is a schematic view of a part of components in the server in FIG. 2A. FIG. 4A is a front view of an electric power transmission unit in FIG. 3. FIG. 4B is a sectional view of the electric power transmission unit in FIG. 3 along Line A-A'. FIG. 4C is a sectional view of the electric power transmission unit in FIG. 3 along Line B-B'. Referring to FIG. 3, and FIG. 4A to FIG. 4C, in this embodiment, the electric power transmission unit 150 includes a power distribution module support base 152 and a power distribution module 154 superimposed on a surface of the power distribution module support base 152 along the vertical axis V1, in which the base 152 is mounted to the back of the rack 110 and extends along the vertical axis V1, so as to transfer electric power to the server unit 120, the communication exchange unit 170 and the rack control unit 180. The power distribution module 154 includes a first conductive plate 1541, an insulating layer 1542 and a second conductive plate 1543 sequentially superimposed on the base 152, in which the insulating layer 1542 is disposed between the first conductive plate 1541 and the second conductive plate 1543.

Furthermore, the power distribution module 154 further includes a first power binding post 1544 plugged on the first conductive plate 1541, and a second power binding post 1545 plugged on the second conductive plate 1543. The first power binding post 1544 and the second power binding post 1545 are provided for connection to the power supply unit 140 to obtain electricity therefrom. Moreover, the power supply module 154 further includes a plurality of output pin pairs 1546, in which each output pin pair 1546 includes a first output pin 1546A plugged on the first conductive plate 1541, and a second output pin 1546B plugged on the second conductive plate 1543. These output pin pairs 1546 are provided for connection to the server unit 120, the communication exchange unit 170 and the rack control unit 180 in the rack 110, so as to transfer electric power to corresponding apparatuses.

Figure 5A:
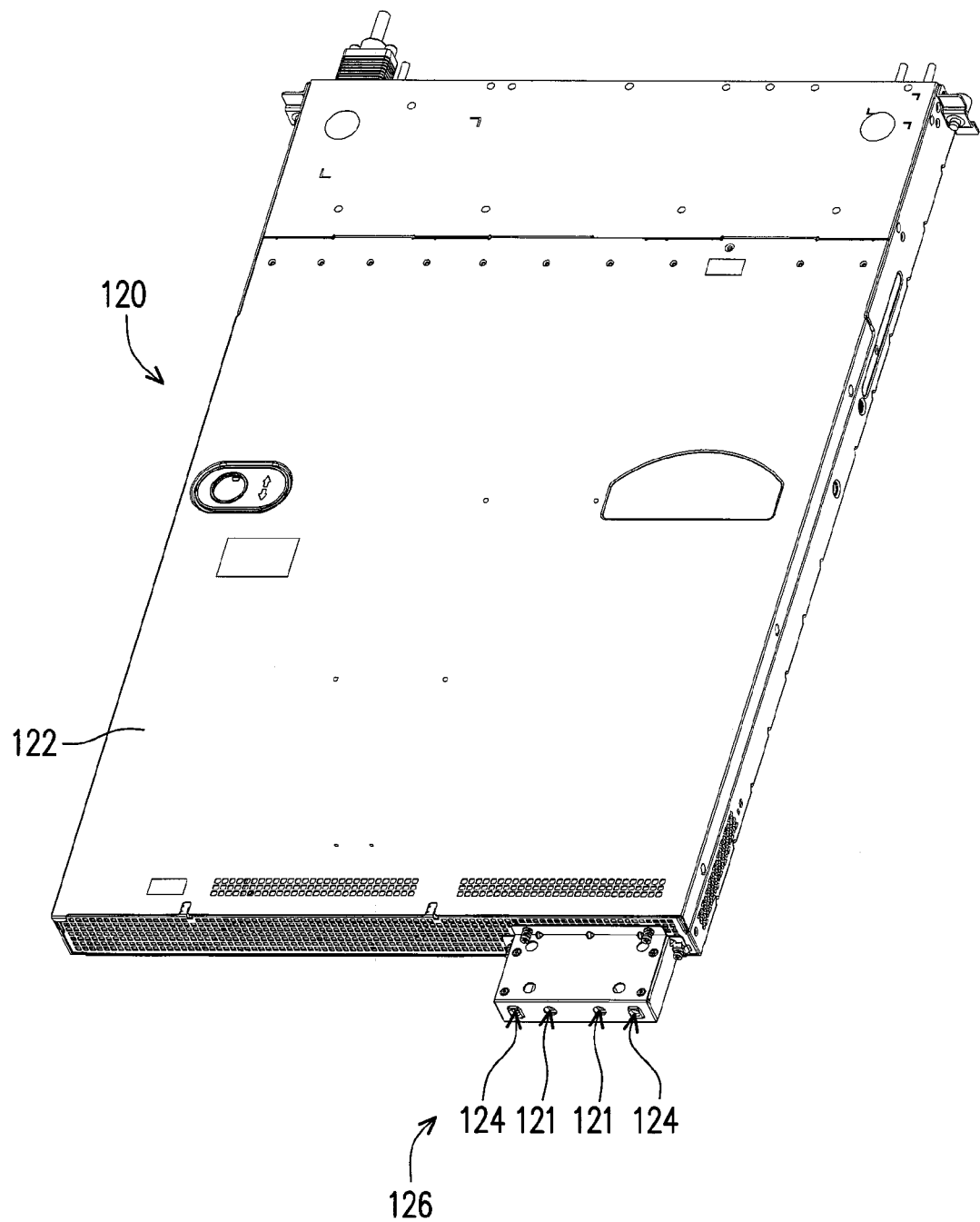
FIG. 5A is a schematic view of a server unit in FIG. 2A at another viewing angle.

FIG. 5A is a schematic view of a server unit in FIG. 2A at another viewing angle. Referring to FIG. 2 to FIG. 5A, in order to enable each of the output pin pairs 1546 to be smoothly connected to the server unit 120, the communication exchange unit 170 and the rack control unit 180 in the rack 110, in this embodiment, a plurality of groups of electrically neutral (e.g., non-conducting or grounded) positioning posts 156 are disposed on the power distribution module support base 152 of the electric power transmission unit 150, and the position of each group of positioning posts 156 correspondingly matches an output pin pair 1546 protruding on the first conductive plate 1541 and the second conductive plate 1543, while a pair of positioning holes 124 corresponding to the positioning posts 156 are disposed in the server unit 120, the communication exchange unit 170 and the rack control unit 180. Herein, it should be noted that, only the server unit 120 is taken as an example for illustration herein because the server unit 120, the communication exchange unit 170 and the rack control unit 180 all have the same positioning holes 124 at respective backs.

In other words, when positioning posts 156 are correspondingly plugged into positioning holes 124 on the server unit 120, the communication exchange unit 170 and the rack control unit 180, the output pin pairs 1546 are electrically connected to pairs of electrodes 121 of the server unit 120, the communication exchange unit 170 and the rack control unit 180 respectively, so as to transfer electric power to the server unit 120, the communication exchange unit 170 and the rack control unit 180. Furthermore, disposition positions of one of the groups of positioning posts 156 and a corresponding output pin pair 1546 in the rack 110 are provided in the same relative position for each layer of shelving space C1 in the rack 110. That is, the shelving spaces C1 used for accommodating the server unit 120, the communication exchange unit 170 and the rack control unit 180 all have a corresponding power supply connection structure. In this way, no matter whether the server unit 120, the communication exchange unit 170 or the rack control unit 180 is moved into the shelving space C1, a plug-and-play structure is formed due to the power supply connection structure, so as to improve applicability and efficiency of the server 100.

Figure 5B:
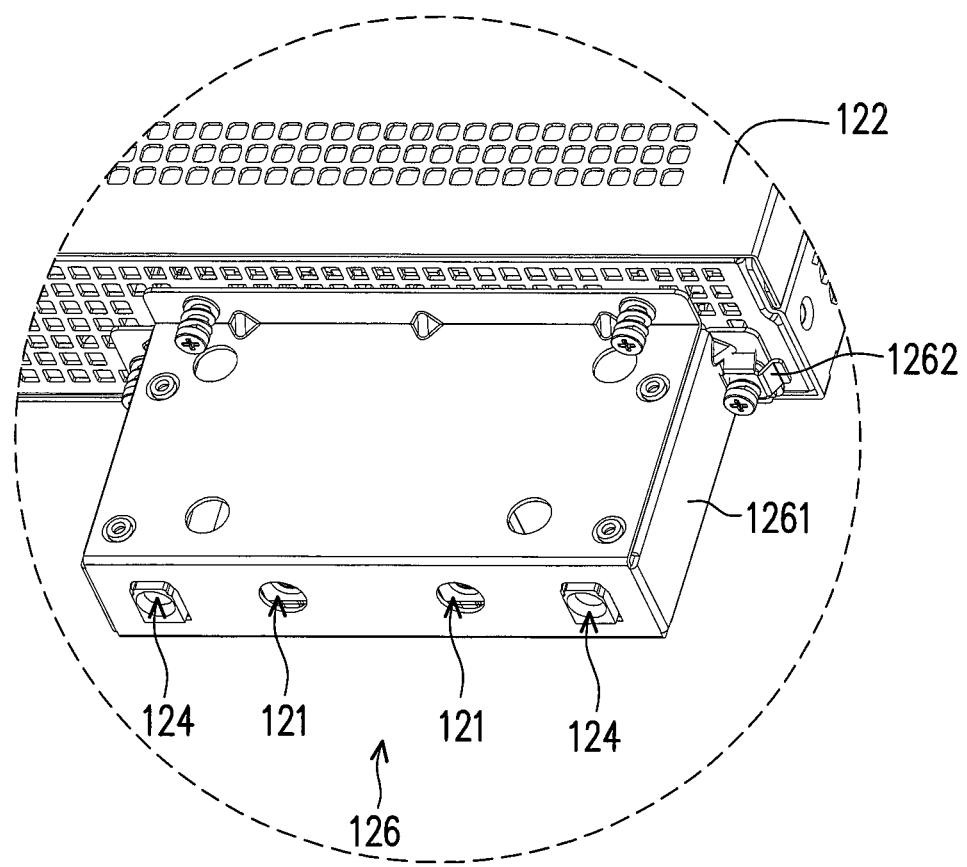
FIG. 5B is a partially enlarged view of FIG. 5A.
Figure 5C:
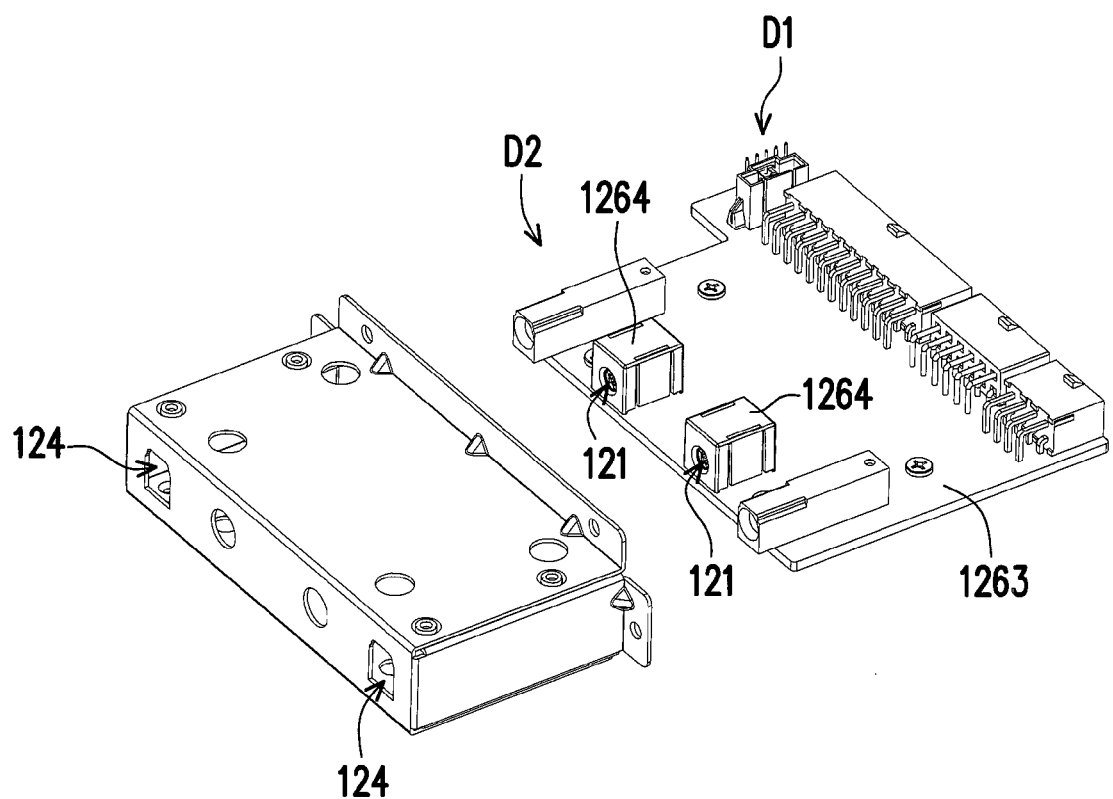
FIG. 5C is an exploded view of an electrical connection module in FIG. 5A.

FIG. 5B is a partially enlarged view of FIG. 5A. FIG. 5C is an exploded view of an electrical connection module in FIG. 5A. Referring to FIG. 3, and FIG. 5A to FIG. 5C, further, the server unit 120 includes a chassis 122 and an electrical connection module 126 disposed at the back of the chassis 122. The chassis 122 is used to accommodate a plurality of electronic elements (not shown). The electrical connection module 126 includes a housing 1261, an adjustable position limiting piece 1262, a circuit board 1263 and at least one connector 1264.

The positioning holes 124 are disposed in the housing 1261. The adjustable position limiting piece 1262 connects the housing 1261 onto the chassis 122, and an adjustment space region is formed between the housing 1261 and the chassis 122. The space position of the housing 1261 may vary relative to the chassis 122 in the adjustment space region. The circuit board 1263 is disposed in the housing 1261, and has a first connection end D1 corresponding to the chassis 122 and a second connection end D2 corresponding to the power supply unit 140. The connector 1264 is located on the circuit board 1263 and is electrically connected to the second connection end D2. Electrodes 121 are located on the connector 1264; when the chassis 122 enters the shelving space C1, a corresponding group of positioning posts 156 on the power supply unit 140 are plugged into the positioning holes 124, and corresponding output pin pairs 1546 are electrically connected to the electrodes 121 respectively. Likewise, the communication exchange unit 170 and the rack control unit 180 also have the same structure, so details are not repeated herein.

Figure 6:
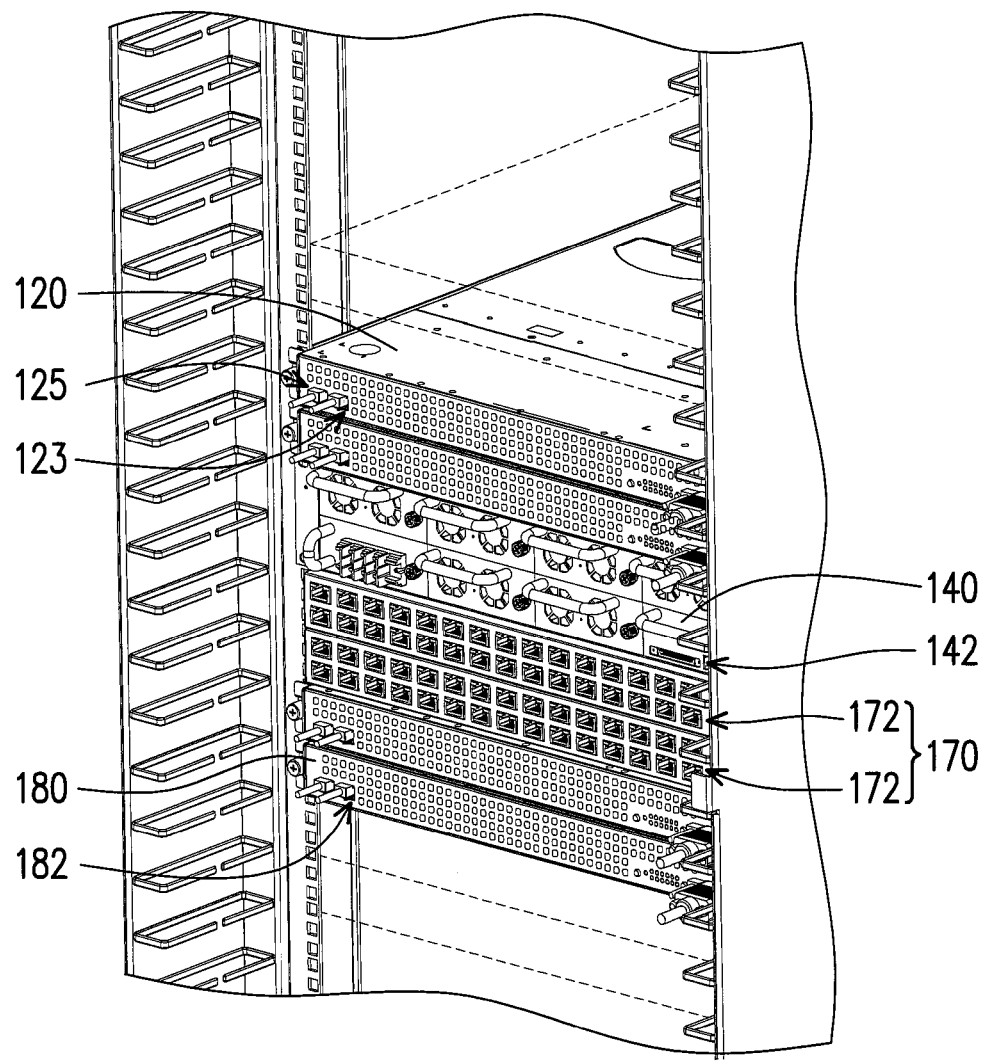
FIG. 6 is a partially enlarged view of the server unit in FIG. 2A.

FIG. 6 is a partially enlarged view of the server unit in FIG. 2A. Referring to FIG. 2A and FIG. 6, in this embodiment, the communication exchange unit 170 includes a management network exchange unit 172 and a serving network exchange unit 174. Each of the server units 120 further has a management network interface 123 and a serving network interface 125. The management network interface 123 of each of the server units 120 is communicatively connected with the management network exchange unit 172. The serving network interface 125 of each of the server units 120 is communicatively connected with the serving network exchange unit 174. Furthermore, the rack control unit 180 has a management network interface 182 and is connected to the management network exchange unit 172 through this management network interface 182, thereby performing communication in a management network with each of the server units 120. The power supply unit 140 is disposed in a plurality of shelving spaces C1, and is located in the middle of each of the shelving spaces C1. The communication exchange unit 170 is located in a shelving space C1 close to the power supply unit 140. Each power supply unit 140 has a management network interface 142 and is connected to the management network exchange unit 172 through this management network interface 142.

Referring to FIG. 2A and FIG. 2B, herein, it should be noted that, the server unit 120, the power supply unit 140, the communication exchange unit 170 and the rack control unit 180 are electrically connected to each other through a plurality of cables 190. In this chassis, if the cables 190 are not sorted out, operations of the units and their relevant heat dissipation are easily influenced due to the disorganized arrangement of the cables 190. Therefore, an internal front portion of the rack 110 is disposed with a cable sorting structure 111. A plurality of cables 190 between the server unit 120, the communication exchange unit 170 and the rack control unit 180 is threaded in the cable sorting structure 111, extends along the cable sorting structure 111, is threaded out of the rack 110 from an opening 113 on the top of the rack 110 and is connected to an external device (not shown).

Figure 7:
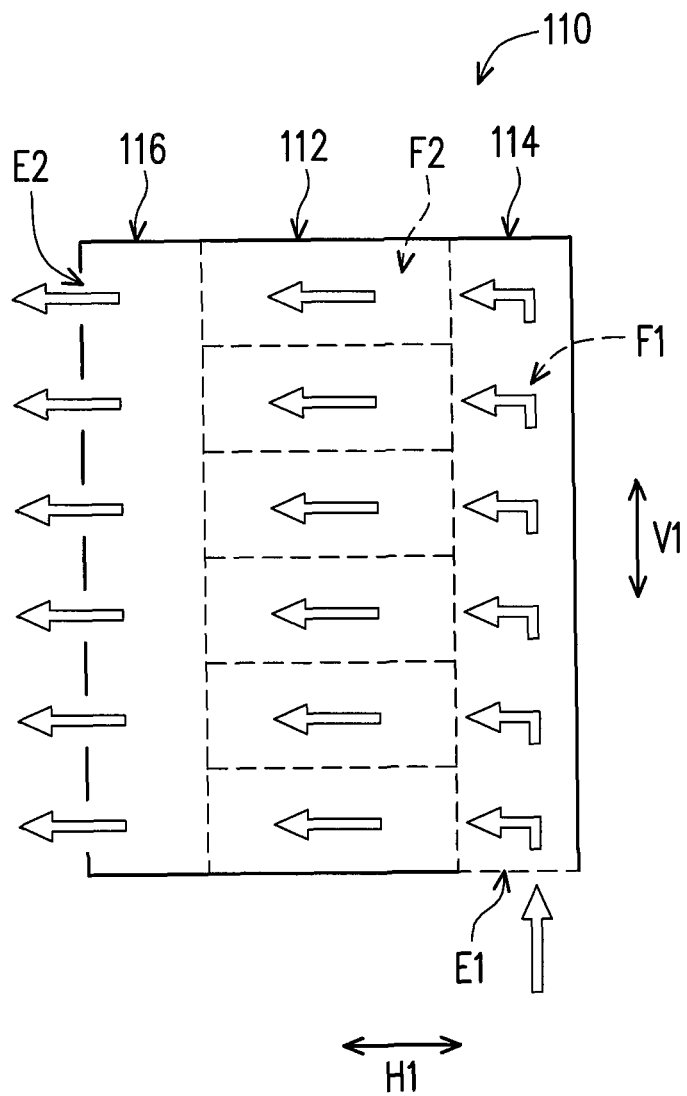
FIG. 7 is a schematic view of air flowing in the server in FIG. 1A.

FIG. 7 is a schematic view of air flowing in the server in FIG. 1A. Referring to FIG. 2A, FIG. 2B and FIG. 7, specifically, the rack 110 includes a body 112, a front frame 114 and a rear frame 116. The body 112 has the shelving spaces C1. The front frame 114 and the rear frame 116 are mounted to two opposite sides of the body 112. The bottom side of the front frame 114 has an air inlet E1, the rear frame 116 has an air outlet E2, the electric power transmission unit 150 is mounted to the rear frame 116, and an air flow (indicated with an arrow drawn in FIG. 7) flows into the rack 110 along the vertical axis V1 from the air inlet E1, flows through each of the server units 120 along the horizontal axis H1 and flows out of the rack 110 from the air outlet E2. The front frame 114 further has a first net structure 114a, so as to form the air inlet E1 and filter the air going therethrough; the server unit 120 further has a pair of second net structures 120a, so as to enable the air flow to pass through the shelving space C1 through the second net structures 120a.

Referring to FIG. 1A, FIG. 2A and FIG. 7, it should be noted that the rack 110 further includes a cover 118, which is openably and closably mounted to the front frame 114. When the cover 118 is closed relative to the front frame 114, a first flow passage F1 is formed between the cover 118, the front frame 114 and the body 112, and the first flow passage F1 is parallel to the vertical axis V1 and is connected to the air inlet E1. Furthermore, the rack 110 further has a plurality of second flow passages F2, which are respectively connected between the first flow passage F1 and the air outlet E2. The fan module 130 is mounted to the air outlet E2 of the rear frame 116, and the fan module 130 withdraws air in the second flow passage F2 from the rack 110 along the horizontal axis H1, so that external air flows into the rack 110 from the air inlet E1 and an air flow is formed in the internal space of the rack 110.

Referring to FIG. 2A, FIG. 2B and FIG. 7, in this embodiment, on a plane P1 with the horizontal axis H1 being the normal, the orthogonal projection of the electric power transmission unit 150 on the plane P1 does not overlap the orthogonal projections of the air outlet E2 and the second flow passage F2 on the plane P1 respectively. The cable sorting structure 111 is disposed at the front frame 114, and is located beside the first flow passage F1. Further, the front frame 114 has a recess or groove 114b located in an inner wall thereof, and the cable sorting structure 111 includes a plurality of position limiting pieces 111a, which is disposed in the recess 114b in an array along the vertical axis V1. Each of the position limiting pieces 111a includes a collar (which may be circular, rectangular, or any other suitable shape and which may include a small perimetrical gap for inserting a cable therethrough) parallel to a plane P2 with the vertical axis V1 being the normal, and the cables 190 are threaded through the collar or inserted through the gap and are limited therein.

Base on the above description, the electric power transmission unit 150 and the cables 190 do not obstruct the flow passage of the internal air flow of the rack 110, so the server 100 of this embodiment has good heat dissipation effect.

Figure 8A:
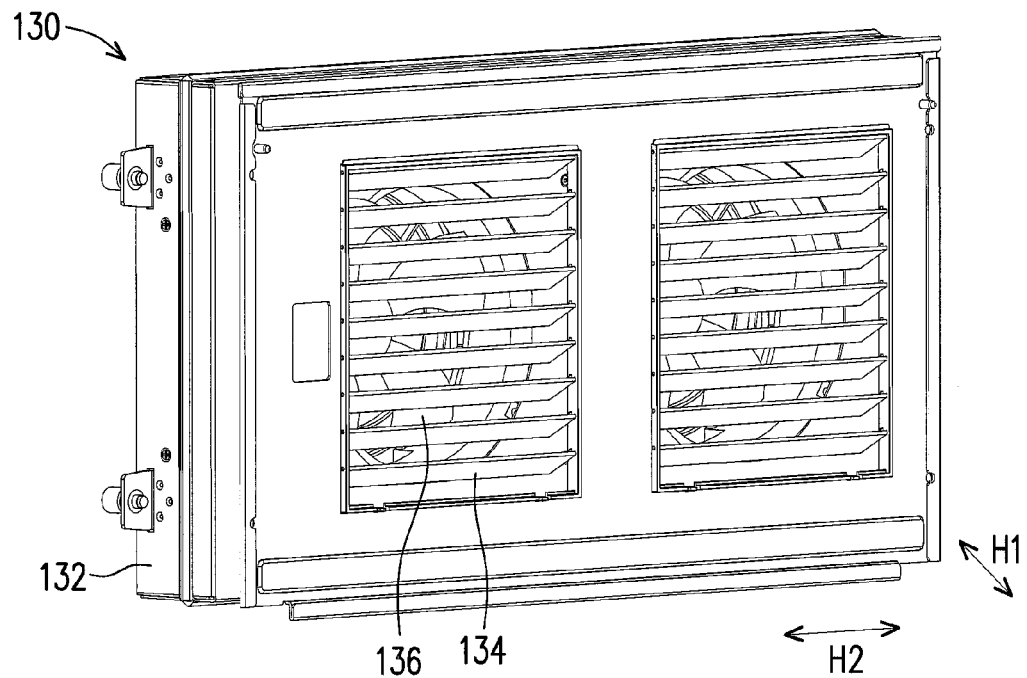
FIG. 8A and FIG. 8B are schematic views of a fan unit in the server in FIG. 2A in different states respectively.
Figure 8B:
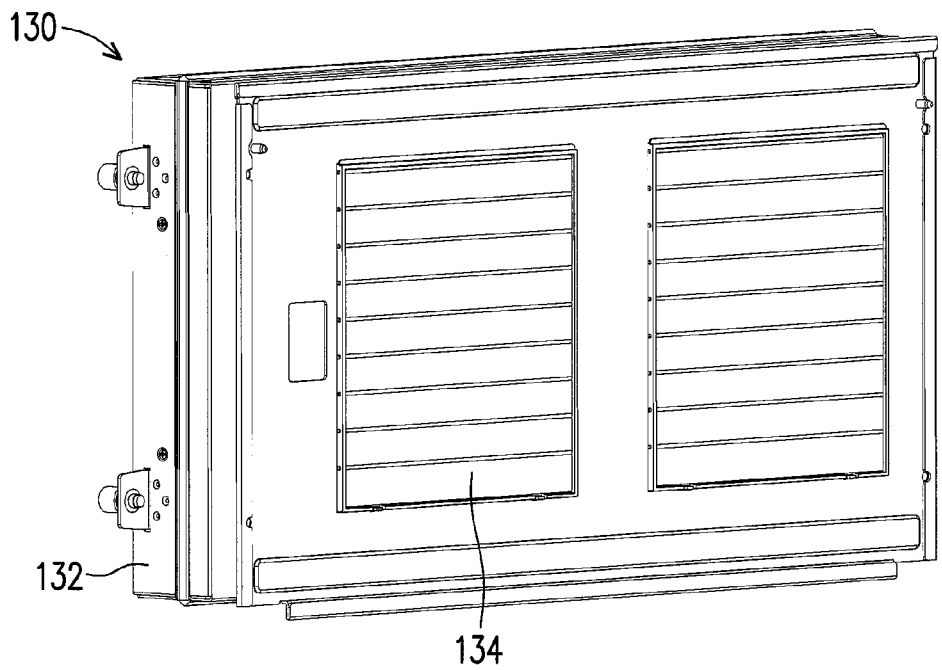

FIG. 8A and FIG. 8B are schematic views of a fan unit in the server in FIG. 2A in different states respectively. Referring to FIG. 2A, FIG. 8A and FIG. 8B, in this embodiment, the fan module 130 is disposed at the air outlet E2 (shown in FIG. 7) of the rear frame 116, the fan module 130 is arranged along the vertical axis V1 and each fan module 130 is aligned with a plurality of the shelving spaces C1. Each fan module 130 includes a fan shelf 132, a movable air vent apparatus 134 and a plurality of fan units 136. In this embodiment, only one fan shelf 132 in cooperation with one air vent apparatus 134 and two fan units 136 is taken as an example.

The fan shelf 132 is detachably mounted to the rear frame 116, and the fan shelf 132 is electrically connected to the rack 110 independently and is detached from the rack 110 independently. The movable air vent apparatus 134 is mounted to the fan shelf 132 and opens or closes the air outlet E2. The fan unit 136 is detachably mounted to the fan shelf 132 along the horizontal axis H1 and is arranged along a horizontal direction H2, each fan unit 136 is electrically connected to the fan shelf 132 independently, and is suitable for being detached independently from the fan shelf 132 along the horizontal axis H1 or mounted to the fan shelf 132 reversely and independently.

Figure 8C:
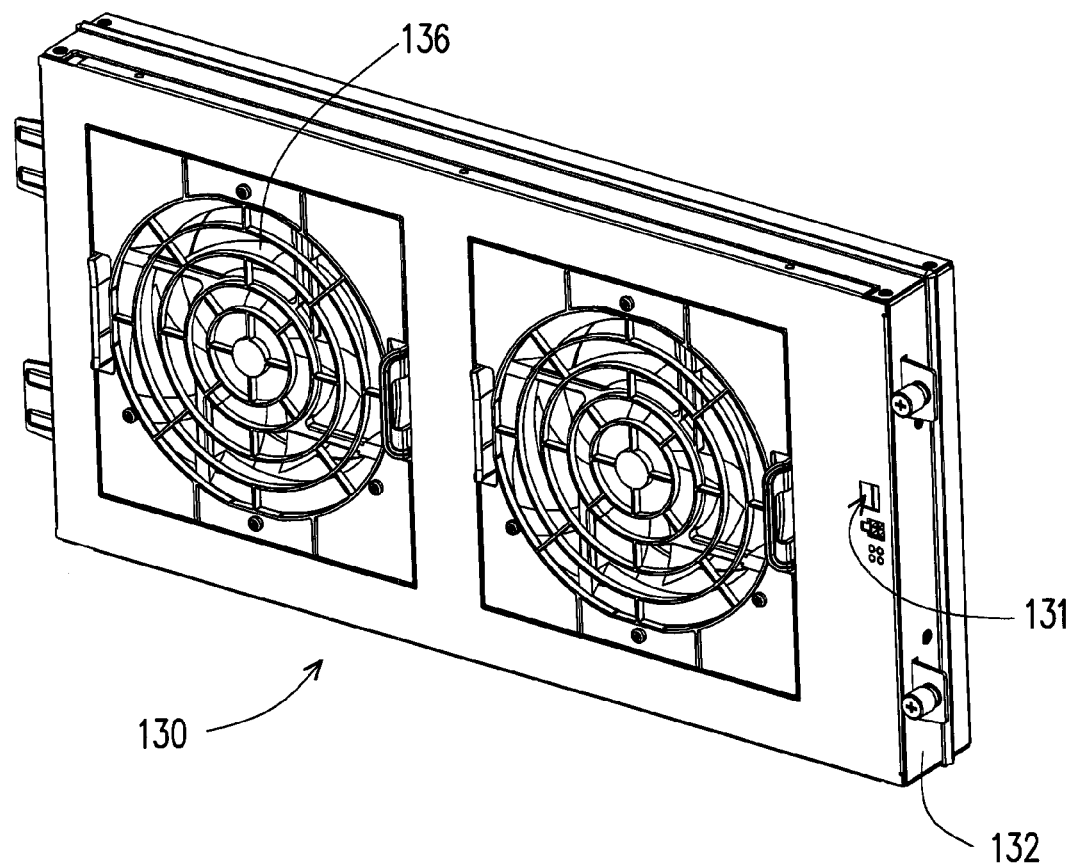
FIG. 8C is a schematic view of a fan module in FIG. 8A at an opposite viewing angle.
Figure 9:
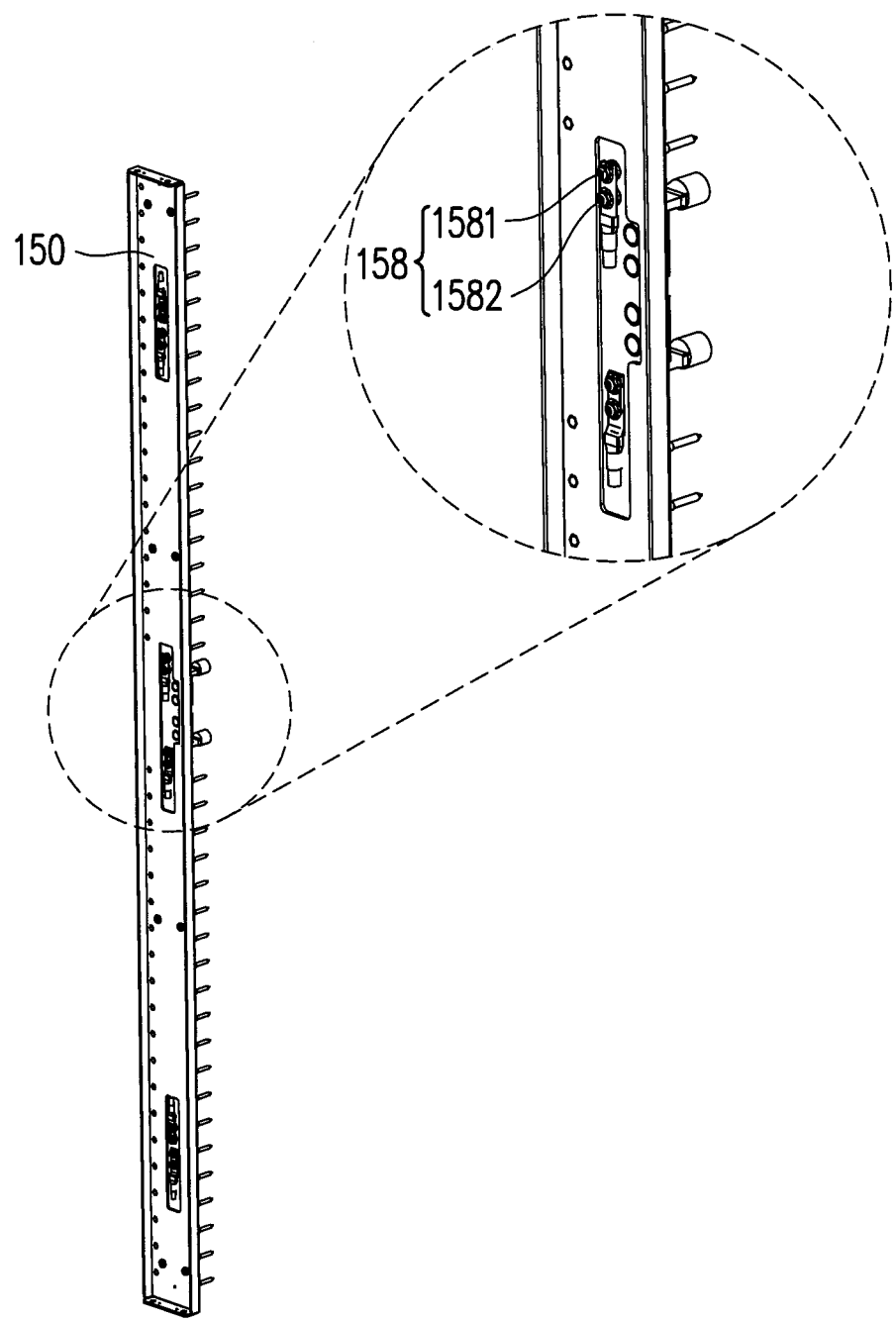
FIG. 9 is a schematic view of the electric power transmission unit in FIG. 3 at an opposite viewing angle.

Furthermore, FIG. 8C is a schematic view of a fan module in FIG. 8A at an opposite viewing angle. FIG. 9 is a schematic view of the electric power transmission unit in FIG. 3 at an opposite viewing angle. Referring to FIG. 2A, FIG. 8C and FIG. 9, the electric power transmission unit 150 is disposed between the fan modules 130 and the shelving space C1 of the rack 110; the electric power transmission unit 150 further includes a plurality of fan pin pairs 158, each fan pin pair 158 includes a first fan pin 1581 plugged on the first conductive plate 1541 (shown in FIG. 4B), and a second fan pin 1582 plugged on the second conductive plate 1543 (shown in FIG. 4B); both the first fan pin 1581 and the second fan pin 1582 protrude toward the fan module 130 through through-holes on the base 152, and the fan pin pair 158 is provided for connection to the fan unit 136, so as to transfer electric power to the fan unit 136. Each fan module 130 has a management network interface 131 and is connected to the management network exchange unit 172 through the management network interface 131, so as to enable the rack control unit 180 to communicate with the fan module 130 through the management network exchange unit 172.

Figure 10:
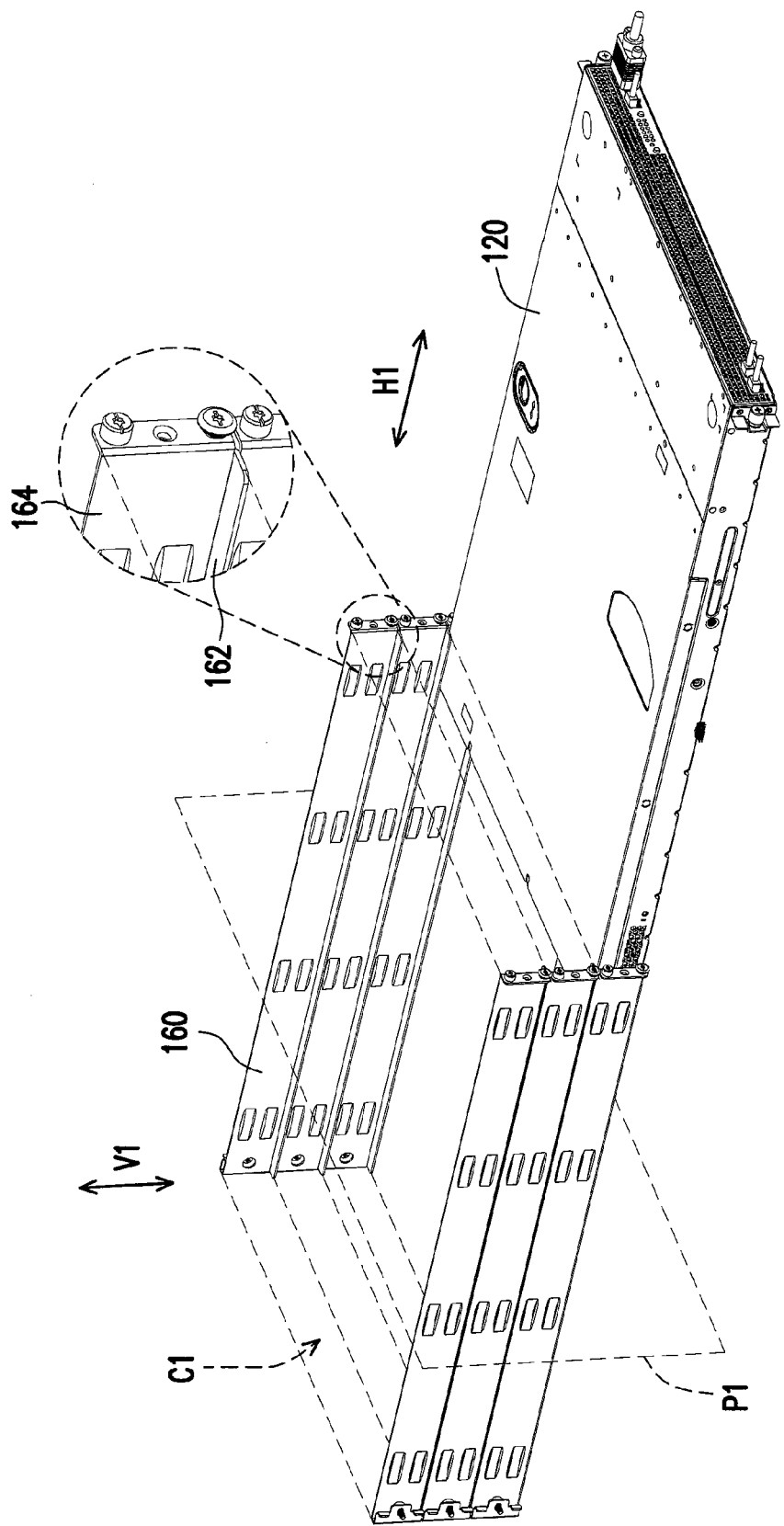
FIG. 10 is a schematic view obtained after the server unit in the server in FIG. 2A moves out of a shelving space.

FIG. 10 is a schematic view obtained after the server unit in the server in FIG. 2A moves out of a shelving space. Referring to FIG. 2A, FIG. 2B and FIG. 10, in this embodiment, the server 100 further includes a plurality of pairs of rails 160, which is mounted to the body 112 in an array along the vertical axis V1, and forms the shelving space C1, so as to enable the server unit 120 to be moved into or moved out of the shelving space C1 along the rails 160. Further, the body 112 includes a base 112a and a plurality of support posts 112b erected on the base 112a.

The rails 160 are mounted onto the support posts 112b in pairs opposite to each other, and the extension direction of each support post 112b is parallel to the vertical axis V1. Each rail 160 has a base plate 162 and a side plate 164 perpendicular to each other, which for example, is formed by bending a plate piece, that is, the profile of the orthogonal projection of each rail 160 on the first plane P1 is in an L shape. Moreover, the shelving space C1 is collectively formed of a base plate 162 and a side plate 164 of a pair of rails and a base plate 162 of another pair of rails 160 adjacent to the pair of rails. Furthermore, the dimension of each rail 160 along the horizontal axis H1 is smaller than the dimension of the server unit 120 along the horizontal axis H1. In other words, the length of the rail 160 is smaller than the length of the server unit 120. In this way, it is sufficient for the length of the rail 160 mounted to the rack 110 to support the server unit 120 without the necessity of completely conforming to the length of the server unit 120, so that the space occupied by the rails 160 is further diminished, thereby also increasing the available space of the server unit 120.

In conclusion, in the embodiment of the present invention, through the internal layout and the relevant disposition of the rack, and the electric power transmission unit disposed in the rack, the server uniformly supplies power to the apparatus units including the communication exchange unit and the rack control unit in the rack, thereby conveniently and effectively performing entire management and power consumption control, and effectively saving the number of cables of each apparatus unit and the layout thereof. In addition to simplifying the internal layout of the rack to improve the operation convenience of the server unit, this practice can achieve good heat dissipation efficiency in cooperation with the particularly designed heat dissipation air passage. Further, the centralized fan system is also convenient for uniform management and control and energy consumption reduction likewise.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A server, comprising:
a rack, having a plurality of shelving spaces;
at least one server unit, operable to be moved into or moved out of the corresponding shelving space along a horizontal axis;
at least one communication exchange unit, operable to be moved into or moved out of the corresponding shelving space along the horizontal axis, Wherein the server unit is communicatively connected onto the communication exchange unit;

at least one rack control unit, operable to be moved into or moved out of the corresponding shelving space along the horizontal axis the server unit communicates with the rack control unit through the communication exchange unit;

an electric power transmission unit, disposed in the rack and running adjacent the shelving spaces along a vertical axis; and a power supply unit disposed in the rack, wherein the electric, power transmission unit comprises:
  a power transmission module support base, mounted to the rack back and extending along the vertical axis; and
  a power transmission module, superimposed on a surface of the power transmission module support base along a direction of the vertical axis, the power transmission module comprises;
    a first conductive plate, an insulating layer and a second conductive plate sequentially superimposed on the power transmission module support base, wherein the insulating layer is disposed between the first conductive plate and the second conductive plate;
    a first power binding post plugged on the first conductive plate, and a second power binding post plugged on the second conductive plate, wherein the first power binding post and the second power binding post are provided for connection to the power supply unit to obtain electric power; and
    a plurality of output pin pairs, wherein each output pin pair comprises a first output pin plugged on the first conductive plate, and a second output pin plugged on the second conductive plate, the output pin pairs are provided for connection to the server unit, the communication exchange unit and the rack control unit in the rack, so as to transfer electric power to the server unit, the communication exchange unit, and the rack control unit in the rack;

wherein after the server unit, communication exchange unit, or rack control unit is moved into the corresponding shelving space, it is electrically connected to the electric power transmission unit.

2. The server according to claim 1, wherein a plurality of pairs of positioning posts are disposed on the power transmission module support base, and positions of each pair of positioning posts are aligned with put pin pair protruding on the first conductive plate and the second conductive plate,
  wherein a pair of corresponding positioning holes is disposed in each of the server unit, the communication exchange unit, and the rack control unit;
  wherein when the pair of positioning posts is plugged into a corresponding pair of positioning holes in the server, communication exchange, or rack control unit, the output pin pair is electrically connected to a pair of electrodes of the unit, so as to transfer electric power to the unit, wherein groups of positioning posts and corresponding output pin pairs are provided in the same relative position for each layer of shelving space in the rack.

3. The server according to claim 2, wherein the server unit, the communication exchange unit, and the rack control unit each comprises:
  a chassis;
  an electrical connection module, comprising:
    a housing, wherein the pair of positioning holes are disposed in the housing;
    an adjustable position limiting piece, connecting the housing onto the chassis, wherein an adjustment space is formed between the housing and the chassis, and a position of the housing varies relative to the chassis in the adjustment space;
    a circuit board, disposed in the housing, and having a first connection end corresponding to the chassis and a second connection end for connection to the power distribution module; and
    at least one connector, located on the circuit board and electrically connected to the second connection end, Wherein the pair of electrodes are located on the connector, and when the chassis enters the shelving space, a corresponding group of positioning posts on the power distribution module are plugged into the pair of positioning holes, and the corresponding output pin pair is electrically connected to the pair of electrodes respectively.

4. The server according to claim 1, having at least two communication exchange units and a plurality of server units, the communication exchange units comprising a management network exchange unit and a serving network exchange unit;
  wherein each of the server units comprises a management network interface and a serving network interface, the management network interface of each of the server units is communicatively connected with the management network exchange unit, and the serving network interface of each of the server units is communicatively connected with the serving network exchange unit;
  wherein the rack control unit comprises a management network interface and is connected to the management network exchange unit through the management network interface, thereby performing communication in a management network with each of the server units.

5. The server according to claim 4, wherein the power supply unit is disposed in the middle of one of the plurality of shelving spaces, the communication exchange units are located in shelving spaces close to the power supply unit, and the power supply unit comprises a management network interface and is connected to the management network exchange unit through the management network interface.

6. The server according to claim 4, wherein an internal front portion of the rack is disposed with a cable sorting structure, and a plurality of cables between the communication exchange units and the server units and rack control units are threaded in the cable sorting structure.

7. The server according to claim 6, wherein the rack comprises:
  a body, having the shelving spaces; and
  a front frame and a rear frame, mounted to two opposite sides of the body, wherein the bottom side of the front frame comprises an air inlet, the rear frame comprises an air outlet, the electric power transmission unit is mounted to the rear frame, and an air flow flows into the rack along the vertical axis from the air inlet, flows through the server units along the horizontal axis and flows out of the rack from the air outlet.

8. The server according to claim 7, wherein the rack further comprises:
  a cover, openably and closably mounted to the front frame, Wherein when the cover is closed relative to the front frame, a first flow passage is formed between the cover, the front frame and the body, and the first flow passage is parallel to the vertical axis and is connected to the air inlet, wherein the rack further comprises a plurality of second flow passages, respectively connected between the first flow passage and the air outlet; and at least one fan module, mounted to the air outlet of the rear frame, wherein the fan module withdraws the air flow in the second flow passages from the rack along the horizontal axis, wherein on a plane with the horizontal axis being a normal, an orthogonal projection of the electric power transmission unit on the plane does not overlap orthogonal projections of the air outlet: and the second flow passage on the plane respectively.

9. The server according to claim 8, wherein the at least one fan module comprises:
a plurality of fan modules, disposed at the air outlet of the rear frame, wherein the fan modules are arranged along the vertical axis, each of the fan modules is aligned with a plurality of the shelving spaces, and each of the fan modules comprises:
a fan shelf, detachably mounted to the rear frame, wherein the fan shelf is electrically connected to the rack independently and is suitable for being detached from the rack independently;
a movable air vent apparatus, mounted to the fan shelf, for opening or closing the air outlet; and
a plurality of fan units, respectively detachably mounted to the fan shelf along the horizontal axis and arranged along a horizontal direction, wherein each of the fan units is detached from the fan Shelf along the horizontal axis independently or reversely and independently mounted to the fan shelf.

10. The server according to claim 9, wherein the electric power transmission unit is disposed between the fan modules and a shelving space of the rack, and the electric power transmission unit further comprises:

a plurality of fan pin pairs, wherein each fan pin pair comprises a first fan pin plugged on the first conductive plate, and a second fan pin plugged on a second conductive plate, and both the first fan pin and the second fan pin protrude toward the fan module through through-holes on the power distribution module support base; and the plurality of fan pin pairs is used to be connected to the fan unit, so as to transfer electric power to the fan unit.

11. The server according to claim 10, wherein each of the fan modules comprises a management network interface and is connected to the management network exchange unit through the management network interface, and the rack control unit communicates with the fan module through the management network exchange unit.

12. The server according to claim 8, wherein the front frame comprises a first net structure, so as to form the air inlet, wherein the server unit comprises a pair of second net structures, and the air flow passes through the shelving spaces through the pair of second net structures.

13. The server according to claim 8, wherein the cable sorting structure is disposed at the front frame, and is located beside the first flow passage.

14. The server according to claim 13, wherein the front frame comprises a recess located in an inner wall thereof and the cable sorting structure comprises:
a plurality of position limiting pieces, disposed in the recess in an array along the vertical axis, wherein each of the position limiting pieces includes a collar parallel to a plane with the vertical axis being a normal and the cables are threaded through or inserted into the collars.

15. The server according to claim 7, further comprising:
a plurality of pairs of rails, mounted to the body in an array along the vertical axis, and forming the shelving spaces, wherein the server unit s moved into or moved out of the shelving space along the pair of rails.

* * * * *